United States Patent
Garandet et al.

(10) Patent No.: US 8,110,285 B2
(45) Date of Patent: Feb. 7, 2012

(54) SELF-SUPPORTED FILM AND SILICON WAFER OBTAINED BY SINTERING

(75) Inventors: Jean-Paul Garandet, Le Bourget du Lac (FR); Béatrice Drevet, Grenoble (FR); Luc Federzoni, Bourgoin-Jallieu (FR)

(73) Assignee: Commissariat a l'Energie Atomique, Paris (FR)

( * ) Notice: Subject to any disclaimer, the term of this patent is extended or adjusted under 35 U.S.C. 154(b) by 342 days.

(21) Appl. No.: 12/453,509

(22) Filed: May 13, 2009

(65) Prior Publication Data

US 2009/0283875 A1 Nov. 19, 2009

(30) Foreign Application Priority Data

May 16, 2008 (FR) ..................... 08 02650

(51) Int. Cl.
*B32B 5/16* (2006.01)
*G11B 11/105* (2006.01)
*H01R 33/00* (2006.01)
*C30B 1/00* (2006.01)
*C30B 3/00* (2006.01)
*C30B 5/00* (2006.01)

(52) U.S. Cl. .......... 428/323; 428/331; 428/332; 439/35; 117/7

(58) Field of Classification Search .................. 428/323, 428/331, 332; 439/35; 117/7
See application file for complete search history.

(56) References Cited

U.S. PATENT DOCUMENTS

| 4,670,096 | A | 6/1987 | Schwirtlich et al. |
| 5,800,611 | A | 9/1998 | Christensen |
| 2004/0082098 | A1 | 4/2004 | Schmid |
| 2004/0126582 | A1 | 7/2004 | Ng et al. |
| 2007/0014682 | A1 | 1/2007 | Hariharan et al. |
| 2007/0178675 | A1 | 8/2007 | Straboni |

FOREIGN PATENT DOCUMENTS

| JP | A-4-292494 | 10/1992 |
| WO | WO 2004/093202 A1 | 10/2004 |

OTHER PUBLICATIONS

MacKintosh, B. et al., "Large Silicon Crystal Hollow-Tube Growth by the Edge-Defined Film-Fed Growth (EFG) Method", Journal of Crystal Growth, (2006), pp. 428-432, vol. 287, Elsevier B.V.
Belouet, C., "Growth of Silicon Ribbons by the Rad Process", Journal of Crystal Growth, (1987), pp. 110-116, vol. 82, Elsevier Science Publishers B.V., North-Holland, Amsterdam.

*Primary Examiner* — Nathan M Nutter
(74) *Attorney, Agent, or Firm* — Oliff & Berridge, PLC

(57) ABSTRACT

A silicon wafer for a photovoltaic cell is produced by a debinding step of a self-supported film formed of at least one main thin layer comprising at least 50% volume of silicon particles, devoid of silicon oxide and encapsulated in a polymer matrix protecting them against oxidation, followed by a sintering step to form the silicon wafer.

18 Claims, 2 Drawing Sheets

SELF-SUPPORTED FILM AND SILICON WAFER OBTAINED BY SINTERING

BACKGROUND OF THE INVENTION

The invention relates to a self-supported film and to a method for producing at least one silicon wafer for a photovoltaic cell.

STATE OF THE ART

Photovoltaic cells are nowadays mainly manufactured from single-crystal silicon or from polycrystalline silicon.

The silicon used in photovoltaic applications can be obtained by means of a liquid process, i.e. from a molten silicon bath. Once the silicon has solidified, for example in the form of an ingot or a film, it is then cut into wafers having a thickness comprised between 100 µm and 500 µm. The wafers are then transformed into photovoltaic cells. However this cutting step is detrimental as it results in loss of material.

To palliate this shortcoming, several techniques for production in wafers or ribbons have been developed over the past few years.

For example, octagonal silicon tubes can be produced by a silicon growth method in ribbon form, also called Edge-defined Film-fed Growth (EFG), consisting in making molten silicon rise inside a capillary die and then bringing it into contact with a seed moving vertically. As reported by B. Mackintosh et al. in the article "Large silicon crystal hollow-tube growth by the Edge-defined Film-fed Growth (EFG) method" (Journal of Crystal Growth (2006) 428-432), the pull rate, limited by the thermomechanical constraints generated in the ribbon, is situated between 1.5 cm/min and 1.8 cm/min.

Another technique, called the RAD (Ribbon Against Drop) process and described in the article "Growth of silicon ribbons by the RAD process" by C. Belouet (Journal of Crystal Growth 82 (1987) 110-116), consists in performing pulling on a foreign substrate which is said to be "hot". Such a substrate is for example a soft graphite ribbon. The graphite ribbon passes vertically through the molten silicon bath so as to be coated with silicon on both its surfaces on leaving the silicon bath. In this case, the maximum value of the solidification rate is the threshold value above which dendritic growth mode is entered, whereas the minimum value is imposed by the thickness targeted for the silicon ribbon. For example, a rate of 10 cm/min enables ribbons with a thickness of 80 µm to be achieved, and the width of the ribbons is limited to values of about 10 cm.

Higher pull rates (about 10 m/min) can be obtained with pulling processes on a foreign support called "cold", such as the horizontal pulling process, also called RGS (Ribbon Growth on Substrate) and mentioned in U.S. Pat. No. 4,670,096. In the RGS process, a support in movement comes into contact with a liquid bath and exits the bath taking a silicon film with it on one of its surfaces. Heat is extracted by conduction in the cold substrate. This results in solidification, initiated from the substrate and generating a small-grain structure in the thickness direction of the ribbon (of about 500 µm) that is not very suitable for applications in the photovoltaic field. The width of the ribbons is about 15 cm, meaning that the yield is about 240 cm² of wafer surface per second.

Instead of using fabrication methods involving a running movement, certain methods have proposed using a molding technique enabling a large number of silicon wafers to be produced at the same time. The molding technique is thus for example described in Patent Application JP-A-4292494 filed by UNION MATERIAL KK in 1992. The mould is formed by a stack of hollowed elemental parts enabling several silicon wafers to be produced in parallel.

Infiltration of the liquid silicon into the mould is achieved either by an external force (for example a piston) or by natural flow. The silicon is then solidified at a rate in the 0.02 to 0.5 cm/min range.

Furthermore, Patent Application WO-A-2004/093202 proposes quite a different technique for forming a silicon wafer. The wafer is achieved by pressing, preferably hot-pressing, a bed of powders arranged between two plates and by heat treating so that a part of the powders is melted or made viscous. Such a method presents the advantage of being able to control the geometry, the roughness and/or the surface state of the wafers formed after pressing and sintering. However, at the present time, there is no method that enables high energy conversion efficiencies to be achieved.

In Patent Application US2007/014682, a method is proposed to compact and densify a high purity silicon powder in defined geometric shapes having a purity close to that of the starting material. These shapes are used for example in the silicon-based photovoltaic industry. The silicon powder is in particular mixed with a selected binder. The mixture is then dried and compressed into desired shapes before undergoing further operations of debinding and sintering. The binder is chosen from silicon-based binders (high purity Fumed silica, high purity colloidal silica or polyalkoxysilanes), and carbon-based binders (polyalkylene carbonate, stearic acid or zinc stearate).

In U.S. Pat. No. 5,800,611, a single-crystal silicon sheet is formed from a polycrystalline sheet obtained by spreading a slurry of silicon powder, a binder and a solvent on a surface and allowing the solvent to evaporate to form a sheet. The binder is then removed by being heated.

OBJECT OF THE INVENTION

The object of the invention is to propose a method for producing at least one silicon wafer, used in the photovoltaic field, remedying the shortcomings of the prior art and more particularly remedying the shortcomings of production methods by pressing and sintering silicon particles.

According to the invention, this object is achieved by the appended claims.

In particular, this object is achieved by a self-supported film formed by at least a main thin layer comprising at least 50% volume of silicon particles encapsulated in a polymer matrix protecting the silicon particles against oxidation, said silicon particles being devoid of silicon oxide and the polymer matrix comprising at least one oxygen-free polymer protecting against oxidation.

This object is also achieved by a method for producing at least one silicon wafer comprising a step of debinding one such self-supported film followed by a sintering step to form the silicon wafer. In addition, according to a development of the invention, the debinding step is preceded by a formation step of said self-supported film comprising at least production of the main thin layer by extrusion of a mixture comprising at least the silicon particles devoid of silicon oxide and granules of at least one oxygen-free polymer protecting against oxidation or of at least one precursor of said oxygen-free polymer.

BRIEF DESCRIPTION OF THE DRAWINGS

Other advantages and features will become more clearly apparent from the following description of particular embodiments of the invention given for non-restrictive example purposes only and represented in the appended drawings in which.

DESCRIPTION OF PARTICULAR EMBODIMENTS

At least one silicon wafer, used in fabrication of a photovoltaic cell, is produced by sintering silicon particles. The silicon wafer is made from a self-supported or self-supporting film, i.e. a film that is able to be handled without the aid of a support. The self-supported film is formed by at least a main thin layer comprising at least 50% volume of silicon particles devoid of silicon oxide and encapsulated in a polymer matrix protecting them against oxidation.

Figure 1:
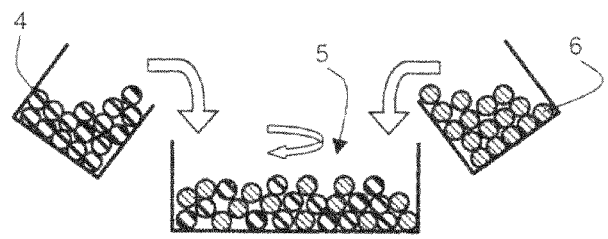
FIGS. 1 to 6 represent different steps of a silicon wafer production according to the invention, schematically and in cross-section.
Figure 2:
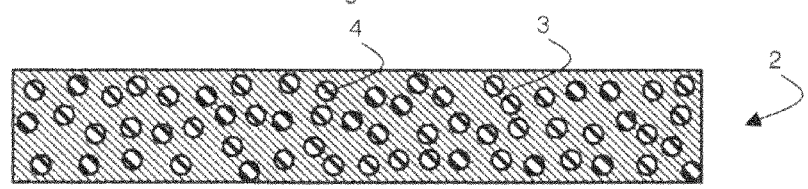

For example purposes and as represented in FIGS. 1 to 6, a silicon wafer 1 is in particular made from a self-supported film 2 as represented in FIG. 2.

In FIG. 2, self-supported film 2 is formed by a single thin layer formed by a polymer matrix 3 in which silicon particles 4 are dispersed.

Silicon particles 4 can for example be particles of micrometric dimensions and/or of nanometric dimensions. In particular, silicon particles of micrometric dimensions advantageously have a mean diameter comprised between 10 µm and 100 µm, whereas silicon particles of nanometric dimensions advantageously have a mean diameter comprised between 10 nm and 100 nm. The use of silicon particles having nanometric dimensions or of a mixture of particles of micrometric dimensions and of particles of nanometric dimensions in particular enables the sintering temperature to be reduced without having to have recourse to melting agents. In addition, reducing the sintering temperature enables better control of the sintering homogeneity and limits the risk of additional pollution. Finally, the use of fine silicon particles enables a silicon wafer having a thinner structured surface to be obtained, which improves light trapping in photovoltaic cells.

Silicon particles 4 are preferably cleaned before being encapsulated in polymer matrix 3 in order to remove the layer of native silicon oxide present at the surface of particles 4. Indeed, even at ambient temperature, silicon becomes covered by a layer of "native" oxide with a thickness of a few nanometers as soon as it is in the presence of oxygen. But the smaller the particles, the more detrimental the presence of a native silicon oxide layer. Thus, for particles of nanometric size, the volume fraction of oxygen can easily reach 10%, which can make the material improper for making photovoltaic cells. Cleaning of the silicon particles 4 can for example be performed in an inert atmosphere by etching with hydrofluoric acid.

Cleaning of the particles is followed by formation of self-supported film 2 comprising at least the silicon particles distributed in the protective polymer matrix 3. The thickness of film 2 can be adjustable. It can for example be comprised between 100 µm and 1 mm. The thin layer forming self-supported film 2 further comprises at least 50% volume of silicon particles, and advantageously between 70% and 85%. The volume load factor of silicon particles in the mixture is for example about 80%. Polymer matrix 6 comprises at least one polymer designed to protect particles 4 against oxidation. Such a polymer is an oxygen-free polymer protecting the silicon particles against oxidation. Advantageously, the oxygen-free polymer protecting against the oxidation is chosen from polymers obtained from one or more monomers of alkene-type. It is more particularly chosen from polyethylene and polypropylene.

In particular and as represented in FIG. 1, self-supported film 2 can be formed by extrusion of a mixture 5 comprising at least silicon particles 4 and granules 6 of at least one oxygen-free polymer protecting against the oxidation or of at least one precursor of said oxygen-free polymer. Mixture 5 can also contain a dispersing agent, such as stearic acid (about 2% volume) to prevent silicon particles 4 from agglomerating in polymer matrix 3. Moreover, depending on their size, the silicon particles can be subjected to a granulation step, before being mixed with granules 6, which gives them suitable Theological properties.

Film 2 obtained by extrusion presents the advantage of being self-supporting. It can thus be run on a moving support 7 formed for example by a graphite conveyor coated with a layer of silicon nitride, which prevents wafer 1 from sticking after the sintering step.

Figure 3:
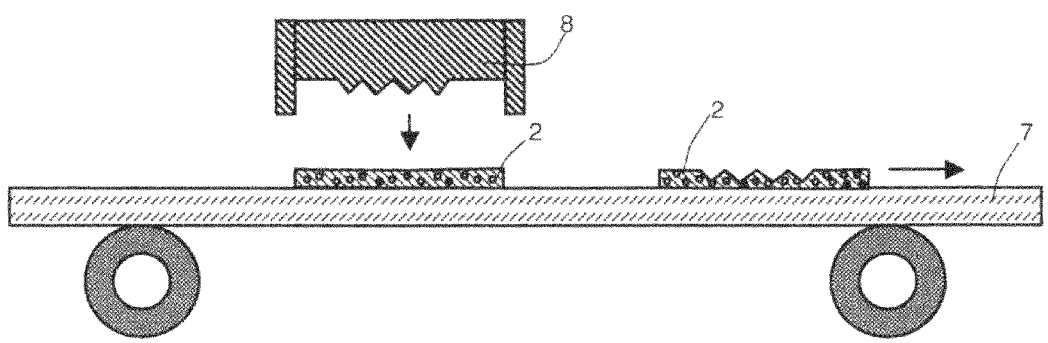

Then, as represented in FIG. 3, self-supported film 2 arranged on support 7 can be cut with a cutting tool 8 to obtain a film 2 having dimensions and a shape that are determined according to the dimensions and shape required for silicon wafer 1 achieved after sintering. More particularly, the cutting operation has to take account of the dimensional reductions occurring in the subsequent steps. The surface of cutting tool 8 coming into contact with the free surface of film 2 can have a particular shape designed to structure the free surface of film 2. The subsequent dimensional reductions are also taken into account when structuring the free surface of film 2.

To produce silicon wafer 1, self-supported film 2 is debinded. In particular the oxygen-free polymer forming matrix 3 is removed by heat treatment at a temperature comprised between about 300° C. and about 500° C. The temperature is for example about 450° C. for a polypropylene or polyethylene matrix. For example, for a film with a thickness of 300 µm of polypropylene comprising 80% silicon particles with a mean diameter of 1 µm, the debinding operation is performed in a resistive furnace for 24 hours at 450° C., with hydrogen scavenging, to remove the debinding residues.

Figure 4:
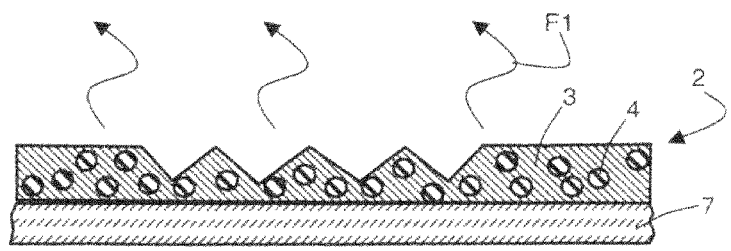
Figure 5:
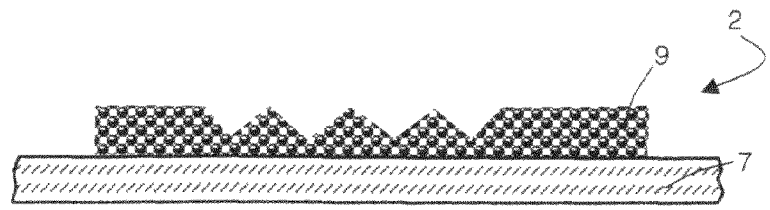

Thus, as illustrated in FIGS. 4 and 5, debinding of film 2 (arrows F1) removes the material encapsulating the silicon particles 2, i.e. matrix 3. The debinding operation thereby enables self-supported film 2 to be transformed into a bed 9 formed by silicon particles and that is polymer-free. Bed 9 further presents a substantially identical shape to that of self-supported film 2, the dimensions of bed 9 however being slightly smaller than those of film 2. This reduction depends on the silicon particle content.

Once film 2 has been debinded, bed 9 undergoes a sintering step to form a wafer 1 made of silicon that is as dense as possible. Sintering in fact enables the silicon particles to be bonded to one another thereby obtaining a dense silicon wafer. It advantageously enables fusion of a part of the particles to be obtained, depending on the size of the silicon particles and on the sintering temperature. The sintering step is advantageously performed at a temperature comprised between about 1000° C. and about 1300° C. depending on the initial size of the silicon particles and on the required porosity. The sintering step is furthermore advantageously performed in a continuous-passage furnace. In general, sintering is performed in the same furnace as that used for the debinding step so as not to have to handle bed 9 which is very fragile. For example, the sintering step can be performed for 4 hours at a temperature of 1300° C. in a hydrogen atmosphere to enable deep hydrogenation of the silicon particles and therefore passivation of the defects, which are in general a limiting factor for the energy efficiency of a photovoltaic cell.

Figure 6:
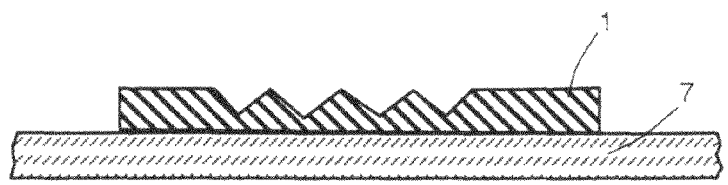

As represented in FIG. 6, silicon wafer 1 presents smaller dimensions than those of bed 9 represented in FIG. 5 and than those of self-supported film 2 represented in FIG. 4.

Such a silicon wafer 1 is ready to use and can be used for making a photovoltaic cell.

The method for producing such a silicon wafer in particular presents the advantage of enabling photovoltaic cells to be achieved with higher energy conversion efficiencies (more than 10%) than those obtained with a production method according to the prior art as described in Patent Application WO-A-2004/093202. Encapsulating silicon particles devoid of silicon oxide in a protective matrix formed by an oxygen-free polymer does in fact protect the particles from oxidation and therefore improves the energy conversion efficiencies of the photovoltaic cells. Furthermore, before silicon wafer 1 is produced by sintering, self-supported film 2 can be stored for a certain time without any particular precautions to prevent oxidation of the particles. It is also easier to handle the silicon particles when the latter are encapsulated in a self-supported film than when they are in bulk form. Implementing silicon particles in the form of a self-supported film does in fact enable powders of large total surface area to be handled without any risk of oxidation. Furthermore, producing a silicon wafer using a self-supported film comprising silicon particles devoid of native oxide and encapsulated in a protective polymer matrix also avoids material losses resulting from the ingot or ribbon cutting operations in liquid process production methods.

Lastly, using at least one oxygen-free polymer and possibly a dispersing agent containing hydrogen improves hydrogenation of the silicon particles compared with production methods according to the prior art. Indeed, with these methods according to the prior art, hydrogen is only introduced at the time the anti-reflective layers of the photovoltaic cells are produced above the emitter, which limits its diffusion in the core of the material of said cell. To complete de-oxygenation of the particles, the debinding step can be performed in a vacuum and a hydrogen flash can be applied when the sintering step is performed.

According to an alternative embodiment, the protective polymer matrix 3 used for the self-supported film can also contain additional charges other than the silicon particles. These additional charges can for example be mineral particles, such as clays having the effect of trapping oxygen and water vapor, or carbon nanotubes. Advantageously, these additional charges are charges of nanometric dimensions. This is particularly advantageous for enhancing the protection and/or barrier properties of polymer matrix 3 against water and oxygen, in particular when the storage periods and/or environment are constraining. When the mineral particles are carbon nanotubes, these particles are eliminated in the debinding step at the same time as matrix 3, unlike clays.

Self-supported film 2 can further comprise a thin layer. The self-supported film can thus be formed by a stack of several superposed layers. The thin layer(s) containing silicon particles 4 is(are) called main thin layer(s).

Figure 7:
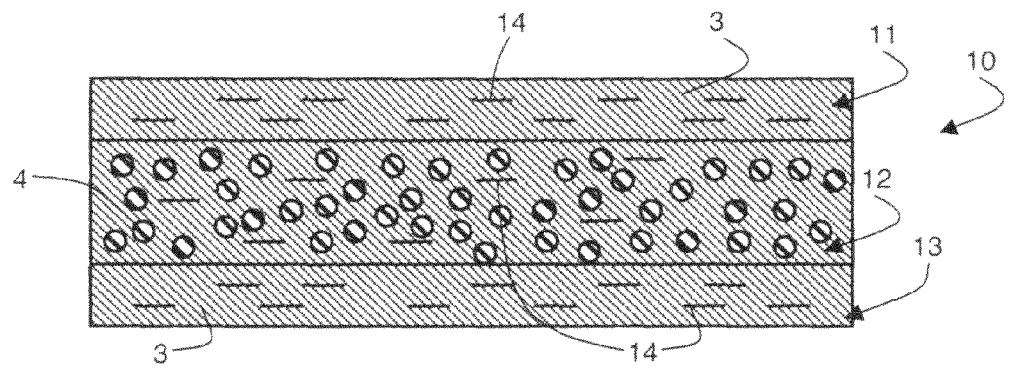
FIGS. 7 and 8 represent two alternative embodiments in a silicon wafer production according to the invention, schematically and in cross-section.

In particular, for example in the case of very fine silicon particles 4, the film can comprise a main thin layer arranged between two protective layers, each of which is formed by polymer matrix 3 without silicon particles 4. The protective layers can also further comprise additional charges, such as mineral charges. For example, in FIG. 7, a self-supported film 10 is formed by three superposed layers 11, 12 and 13. Layer 12 is a main thin layer comprising a protective polymer matrix 3 in which silicon particles 4 and additional charges 14 are uniformly distributed. Main thin layer 12 is arranged between the two protective layers 11 and 13 each comprising protective polymer matrix 3 and additional charges 14.

Figure 8:
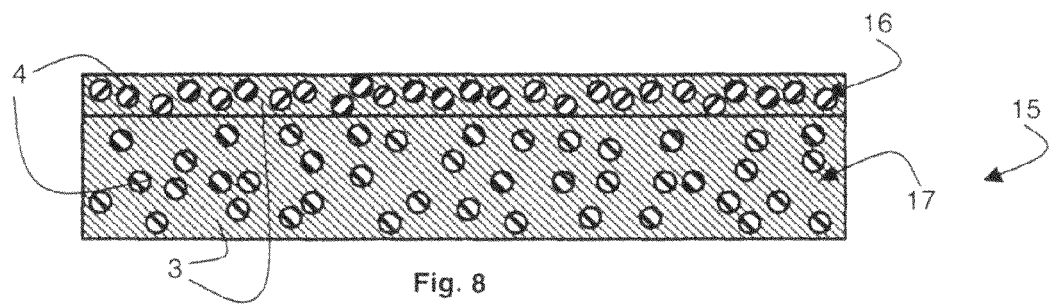

Each main thin layer can further comprise n-type or p-type doping elements. The doping elements are in general added to silicon 4 when the silicon particles are produced, before said particles are mixed with granules 6 of the oxygen-free polymer or of one precursor of said polymer. Thus, in FIG. 8, a self-supported film 15 comprises two superposed main thin layers 16 and 17 each comprising respectively n-doped and p-doped silicon particles. In this case, thin layer 16 of n-doped silicon is much thinner than thin layer 17 of p-doped silicon. The thickness of layer 16 is for example 2 µm for a layer 17 having a thickness of 300 µm. A thin layer 16 as thin as this would be difficult to obtain by conventional extrusion methods. It would for example be achieved by coating or dip-coating thin layer 17, itself achieved by coating.

Thus, according to the invention, superposition of main thin layers containing materials of different types or doping levels in particular enables multilayer silicon wafers to be produced in a more controlled manner than in the method described in Patent Application WO-A-2004/0933202. In the method described in Patent Application WO-A-2004/0933202, mixing of the doping elements due to the effect of mechanical stresses is in fact inevitable at the time the pressing step is performed.

We claim:

1. A self-supported film including at least a main thin layer comprising at least 50% volume of silicon particles encapsulated in a polymer matrix protecting the silicon particles against oxidation, the silicon particles being devoid of silicon oxide and the polymer matrix comprising at least one oxygen-free polymer protecting against oxidation.

2. The film according to claim 1, wherein the main thin layer comprises between 70% and 85% volume of silicon particles.

3. The film according to claim 1, wherein the oxygen-free polymer is formed from at least an alkene monomer.

4. The film according to claim 3, wherein the oxygen-free polymer is selected from the group consisting of polyethylene and polypropylene.

5. The film according to claim 1, wherein at least a part of the silicon particles has a mean diameter comprised between 10 µm and 100 µm.

6. The film according to claim 1, wherein at least a part of the silicon particles has a mean diameter comprised between 10 nm and 100 nm.

7. The film according to claim 1, wherein the main thin layer comprises n-type or p-type doping elements.

8. The film according to claim 1, wherein it comprises at least two superposed main thin layers each comprising respectively n-doped and p-doped silicon particles.

9. The film according to claim 1, wherein it comprises two protective layers each comprising at least the polymer matrix and between which at least the main thin layer is arranged.

10. A method for producing a silicon wafer for a photovoltaic cell, comprising:
   providing a self-supported film including at least a main thin layer comprising at least 50% volume of silicon particles encapsulated in a polymer matrix protecting the silicon particles against oxidation, the silicon particles being devoid of silicon oxide and the polymer matrix comprising at least one oxygen-free polymer protecting against oxidation,
   debinding the self-supported film so as to remove the polymer matrix, and sintering the self-supported film so as to form the silicon wafer.

11. The method according to claim 10, wherein debinding the self-supported film is preceded by forming the self supported film, forming the self-supported film comprising at least production of the main thin layer by extrusion of a mixture comprising at least the silicon particles devoid of silicon oxide and granules of at least one oxygen-free polymer protecting against oxidation or of at least one precursor of said oxygen-free polymer.

12. The method according to claim 11, wherein the mixture comprises a dispersing agent configured to prevent silicon particles from agglomerating in the polymer matrix.

13. The method according to claim 10, wherein the mixture comprises mineral particles absorbing water and oxygen.

14. The method according to claim 13, wherein the mineral particles are selected from the group consisting of clays and carbon nanotubes.

15. The method according to claim 10, wherein the surface of the silicon particles is cleaned with hydrofluoric acid before the main thin layer is formed.

16. The method according to claim 10, wherein debinding the self-supported film comprises heating the self-supported film at a temperature comprised between about 300° C. and about 500° C.

17. The method according to claim 10, wherein sintering the self-supported film comprises heating the self-supported film at a temperature comprised between about 1000° C. and about 1300° C.

18. The method according to claim 10, wherein sintering the self-supported film is performed in a hydrogen atmosphere.

* * * * *